United States Patent
Narwankar et al.

(10) Patent No.: US 6,218,300 B1
(45) Date of Patent: Apr. 17, 2001

(54) METHOD AND APPARATUS FOR FORMING A TITANIUM DOPED TANTALUM PENTAOXIDE DIELECTRIC LAYER USING CVD

(75) Inventors: Pravin K. Narwankar, Sunnyvale; Turgut Sahin, Cupertino; Randall S. Urdahl, Palo Alto; Ankineedu Velaga, Cupertino; Patricia Liu, Saratoga, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/097,301

(22) Filed: Jun. 12, 1998

(51) Int. Cl.[7] .................................................. H01L 21/44
(52) U.S. Cl. ........................ 438/685; 438/785; 438/790; 427/126.3
(58) Field of Search .................................. 438/685, 785, 438/790, 783; 427/126.3

(56) References Cited

U.S. PATENT DOCUMENTS 5,841,186 * 11/1998 Sun et al. .............................. 257/635
5,948,216 * 9/1999 Cava et al. ....................... 204/192.22

FOREIGN PATENT DOCUMENTS

| 0210033 | 1/1987 | (EP) . |
|---|---|---|
| 210033 | * 2/1987 | (EP) . |
| 9500861 | 2/1995 | (KR) . |

OTHER PUBLICATIONS

Treichel, et al. Deposition, annealing and characterization of high–dielectric constant metal oxide films;, Adv. Mat. for Optics and Electronics, vol. 5, No. 3, pp163–175, May 1995.*

Experimental and theoretical study of step coverage in metal–organic chemical vapor deposition of tantalum oxide thin films, Jong–Ho Yun, Shi–Woo Rhee 1997 Thin Solid Films (1997) 324–329.

"Deposition, Annealing and Characterisation of High–dielectric–constant Metal Oxide Films" Avanced Materials for Optics and Electronics vol. 5, No. 3 May 1995 pp. 163–175, H. Treichel, et al.

"Insulation Layer of Capacitor Having High Dielectric Constant . . . " Baek, et al. Feb. 2, 1995, KR 9500 861 Abstract.

Chemical Vapor Deposition of Doped TiO2 Thin Films Sarah R. Kurtz and Roy G. Gordon Thin Solid Films, vol. 147, No. 2 Jan. 1, 1987 pp. 167–176.

* cited by examiner

Primary Examiner—Caridad Everhart
(74) Attorney, Agent, or Firm—Blakely Sokoloff Taylor & Zafman

(57) ABSTRACT

A method and apparatus for forming a titanium doped tantalum pentaoxide dielectric using a CVD process. According to the present invention a substrate is placed in the deposition chamber. A source of tantalum, a source of titanium, and an oxygen containing gas are then fed into the chamber. Thermal energy is used to decompose the source of tantalum to form tantalum atoms, and decompose the source of titanium to form titanium atoms in the deposition chamber. The titanium atoms, tantalum atoms and the oxygen containing gas then react to form a tantalum pentaoxide dielectric film doped with titanium.

30 Claims, 5 Drawing Sheets

METHOD AND APPARATUS FOR FORMING A TITANIUM DOPED TANTALUM PENTAOXIDE DIELECTRIC LAYER USING CVD

BACKGROUND OF THE INVENTION

1. Field of the Invention

The present invention relates to the field of dielectric layer formation and more specifically to a method and apparatus for forming a titanium doped tantalum pentaoxide dielectric layer.

2. Discussion of Related Art

Integrated circuits are made up of literally millions of active and passive devices such as transistors, capacitors and resistors. In order to provide more computational power and/or more storage capability in an integrated circuit, device features are reduced or scaled down in order to provide higher packing density of devices. An important feature to enable scaling of devices is the ability to form high quality, high dielectric constant films for capacitor and gate dielectrics.

One high dielectric constant film that has been proposed is titanium doped tantalum pentaoxide. A conventional method of forming a titanium doped tantalum pentaoxide film is to first deposit a tantalum pentaoxide ($Ta_2O_5$) film and then use ion implantation to dope the film with titanium atoms. A problem with doping the film with ion implantation is that the doping profile for flat surfaces (horizontal surfaces) will differ from that on side surfaces (vertical surfaces). Such differences in doping can cause the different areas to have different electrical properties which makes the process unacceptable in the manufacture of high density capacitors which utilize electrode designs with large aspect ratio openings (greater than 2:1). Additionally, ion implanting titanium atoms into a tantalum pentaoxide film can cause lattice destruction resulting in poor electrical performance such as high leakage currents.

Thus, what is desired is a method and apparatus for forming a titanium doped tantalum pentaoxide film.

SUMMARY OF THE INVENTION

A method and apparatus for forming a titanium doped tantalum pentaoxide dielectric using a chemical vapor deposition (CVD) process is described. According to the present invention a substrate is placed in the deposition chamber. A source of tantalum, a source of titanium, and a source of oxygen are then fed into the chamber. Thermal energy is used to decompose the source of tantalum to form tantalum atoms, and decompose the source of titanium to form titanium atoms in the deposition chamber. The titanium atoms, tantalum atoms and source of oxygen react to form a tantalum pentaoxide dielectric film doped with titanium.

BRIEF DESCRIPTION OF THE DRAWINGS

FIG. 2b is an illustration of a cross-sectional view showing the formation of a titanium doped tantalum pentaoxide dielectric film on the substrate of FIG. 2a.

FIG. 2c is an illustration of a cross-sectional view showing the formation of an annealed titanium doped tantalum pentaoxide dielectric film on the substrate of FIG. 2a.

DETAILED DESCRIPTION OF THE PRESENT INVENTION

The present invention describes a novel method and apparatus for forming a titanium doped tantalum pentaoxide ($Ta_2O_5$) film by chemical vapor deposition (CVD). In the following description numerous specific details such as specific equipment configurations, and process parameters are set forth in order to provide a thorough understanding of the present invention. One skilled in the art will appreciate the ability to use alternative configurations and process details to the disclosed specifics without departing from the scope of the present invention. In other instances, well known semiconductor processing equipment and methodology have not been described in detail in order to not unnecessarily obscure the present invention.

The present invention is a novel method and apparatus for forming a titanium doped tantalum pentaoxide dielectric film. According to the present invention a substrate is placed into a deposition chamber of a thermal reactor. The substrate is then heated to a deposition temperature and the chamber pressure reduced to a deposition pressure. Next, a process gas mix comprising a source of tantalum, such as but not limited to TAT-DMAE [$Ta\ (OC_2H_5)_4\ (OCHCH_2N(CH_3)_2$] and TAETO [$Ta\ (OC_2H_5)_5$], a source of oxygen such as but not limited to $O_2$ and $N_2O$ gas, and a source of titanium such as but not limited to TiPT ($C_{12}H_{26}O_4Ti$) are fed into the deposition chamber. Heat radiating from the substrate thermally decomposes the tantalum source to form tantalum atoms, and thermally decomposes the titanium source to form titanium atoms in the deposition chamber. The tantalum atoms, the titanium atoms, and the source of oxygen then react to form a titanium doped tantalum pentaoxide film on the substrate. The amount of titanium doping of the tantalum pentaoxide film is dependent upon the relative flow (or partial pressures) of the source gases in the deposition chamber.

A titanium doped tantalum pentaoxide film exhibits a higher dielectric constant, about 128 $FF/mm^2$, film than an undoped tantalum pentaoxide dielectric film about 28 $FF/mm^2$. The method of the present invention enables a high dielectric constant film to be uniformly deposited on substrates utilizing electrode designs with high aspect ratio openings, (e.g., aspect ratio greater than 2:1). High dielectric constant films are desirable because they provide high capacitance which enables the reduction of capacitor cell size. The titanium doped tantalum pentaoxide dielectric film of the present is expected to enable the production of DRAM cells at densities greater than 4 Gb.

Figure 1:
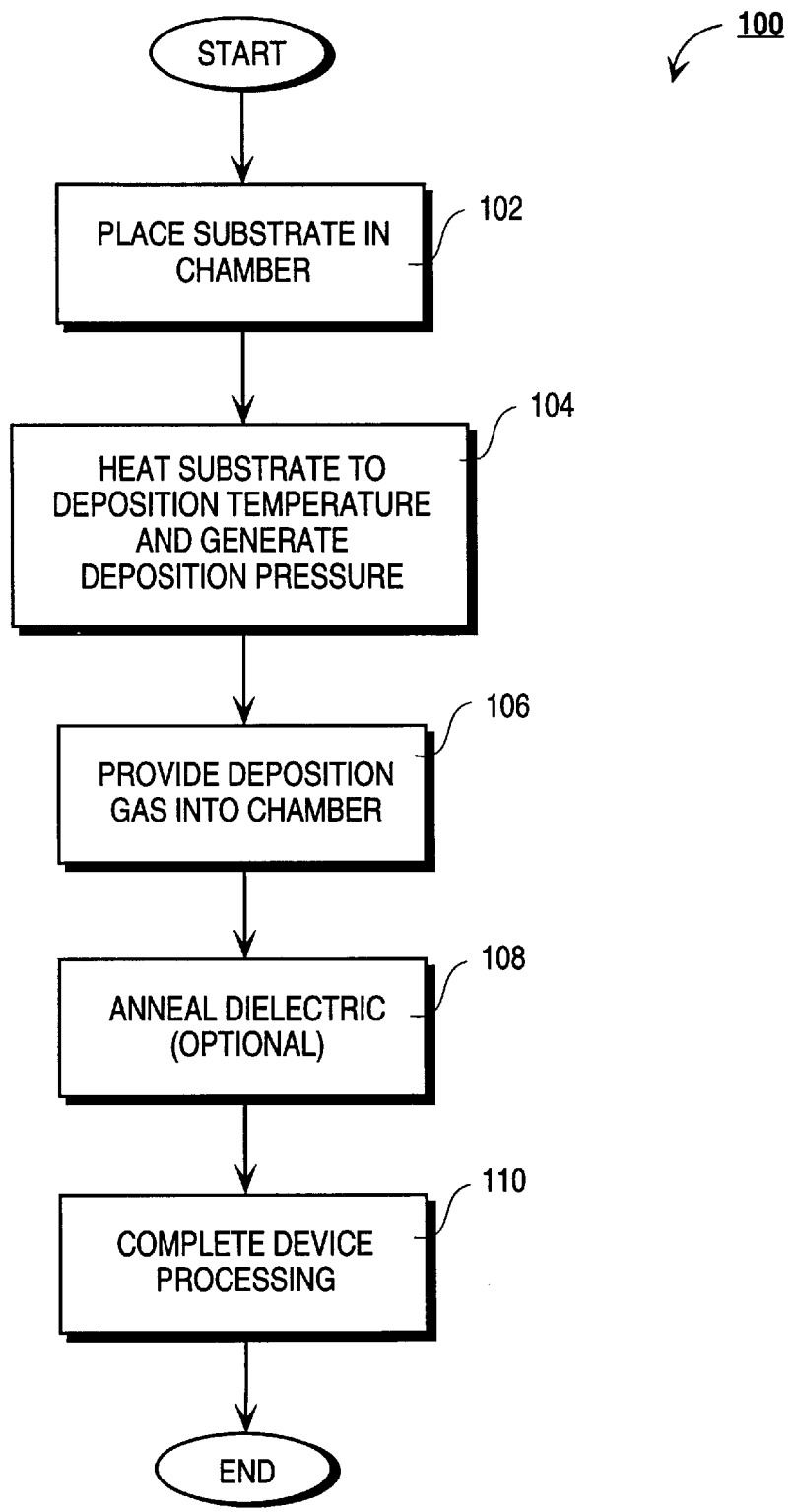
FIG. 1 is a flow chart which illustrates a process of forming a titanium doped tantalum pentaoxide dielectric layer in accordance with the present invention.

A method of forming a titanium doped tantalum pentaoxide dielectric layer in accordance with the present invention will now be described in reference to FIG. 1 and FIGS. 2a–2d. FIG. 1 illustrates a flow chart which depicts a process of forming a titanium doped tantalum pentaoxide dielectric layer in accordance with the present invention. FIGS. 2a–2d illustrate an embodiment of the present invention where a high quality, high dielectric constant, titanium doped tantalum pentaoxide dielectric film is formed for a capacitor of a DRAM cell. It is to be appreciated that these specific details are only illustrative of the embodiment of the present invention and are not to be taken as limiting to the present invention.

The first step, as set forth in block 102 of flow chart 100, of forming a dielectric layer in accordance with the present invention is to place a substrate into a deposition chamber of a thermal chemical vapor deposition reactor. For the purpose of the present invention a substrate is the material on which dielectric films are deposited in accordance with the present invention. The substrate can be a substrate used in the manufacturing of semiconductor products such as silicon substrates and gallium arsenide substrates and can be other substrates used for other purposes such as substrates used in the production of flat panel displays.

Figure 2A:
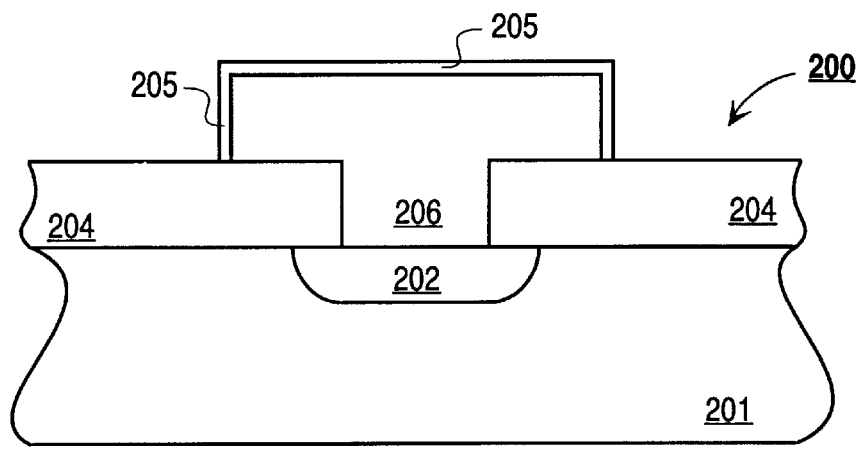
FIG. 2a is an illustration of a substrate including a interlayer dielectric and a bottom capacitor electrode.

In one embodiment of the present invention, the substrate is a substrate used in the fabrication of a dynamic random access memory (DRAM) cells such as substrate 200 shown in FIG. 2a. Substrate 200 includes well known silicon epitaxial substrate 201 having a doped region 202 formed therein and a pattern interlayer dielectric 204 formed thereon. A bottom capacitor electrode 206 is formed in contact with the doped region 202 and over ILD 204. Bottom capacitor electrode 206 can be formed by any well known technique such as by blanket depositing a polysilicon layer by chemical vapor deposition (CVD) utilizing a reactive gas comprising silane ($SiH_4$) and $H_2$ and then patterning the blanket deposited material into an electrode by well known photolithography and etching techniques. If bottom electrode 206 is a polysilicon electrode it will typically be doped to a density between $2-5 \times 10^{20}$ atoms/cm$^3$. Bottom electrode 206 can also be other types of capacitor electrodes such as but not limited to hemispherical grained polysilicon (HSG) or "rough poly" electrodes and metal electrodes such as titanium nitride (TiN) and tungsten (W) electrodes. Additionally, the bottom electrode 206 may include a thin protective barrier layer 205 of for example silicon nitride.

Next, as set forth in block 104 of flow chart 100, the substrate is heated to a desired deposition temperature while the pressure within the chamber is pumped down (reduced) to a desired deposition pressure. The deposition temperature is sufficient to thermally decompose a tantalum source such as but not limited to TAT-DMAE [Ta $(OC_2H_5)_4$ $(OCHCH_2N(CH_3)_2)$], and TAETO [Ta $(OC_2H_5)_5$], into tantalum atoms, and to thermally decompose a titanium source such as TIPT ($C_{12}H_{26}O_4Ti$) into titanium atoms, in sufficient amounts so that additional decomposition sources such as plasma or photo enhancement are not required. A deposition temperature of at least 300° C. and preferably between 300–500° C. is to sufficient to decompose a source of titanium and a source of tantalum. The deposition pressure is preferably between 0.5–10 Torr.

Next, as set forth in block 106 of flow chart 100 a deposition gas mix comprising, a source of tantalum, such as but not limited to, TAETO [Ta $(OC_2H_5)_5$] and TAT-DMAE [Ta $(OC_2H_5)_4$ $(OCHCH_2N(CH_3)_2)$], a source of oxygen such as but not limited to $O_2$ and $N_2O$, and a source of titanium (Ti) such as TIPT (titanium iso peroxide), are fed into the deposition chamber while substrate 200 is at deposition temperature of between 300–500° C. and the chamber is maintained at deposition pressure of between 0.5–10 Torr. In an embodiment of the present invention TAETO or TATD-MAE is fed into the deposition chamber at a rate of between 10–50 milligrams per minute and can be provided by direct liquid injection or vaporized with a bubbler prior to entering the chamber. A carrier gas such as $N_2$, $H_2$ and He at a rate of between 0.5–2.0 SLM can be used to transport TAETO or TAT-DMAE into the deposition chamber. Oxygen ($O_2$) or nitrous oxide ($N_2O$) can be fed into the chamber at a rate of between 0.3–1.0 SLM. Because a small amount of titanium (Ti) source gas is used for doping, the titanium source gas, can be diluted with a suitable solvent, such as isopropyl alcohol (IPA) to better control the amount of the titanium (Ti) source fed into the chamber. TIPT diluted by approximately 50% with IPA can be fed into the chamber by direct liquid injection or vaporized with a bubbler prior to entering the chamber. A carrier gas such as $N_2$ $H_2$ and He can be used to transport the diluted TIPT into the chamber. A TIPT diluted flow rate of between 5–20 mg/min, can be used to produce a tantalum pentaoxide film having a titanium doping density of between 5–20 atomic percent and a dielectric constant between 20–40. The precise (Ti) doping density can be controlled by varying the tantalum source flow relative to the titanium source flow.

Figure 2B:
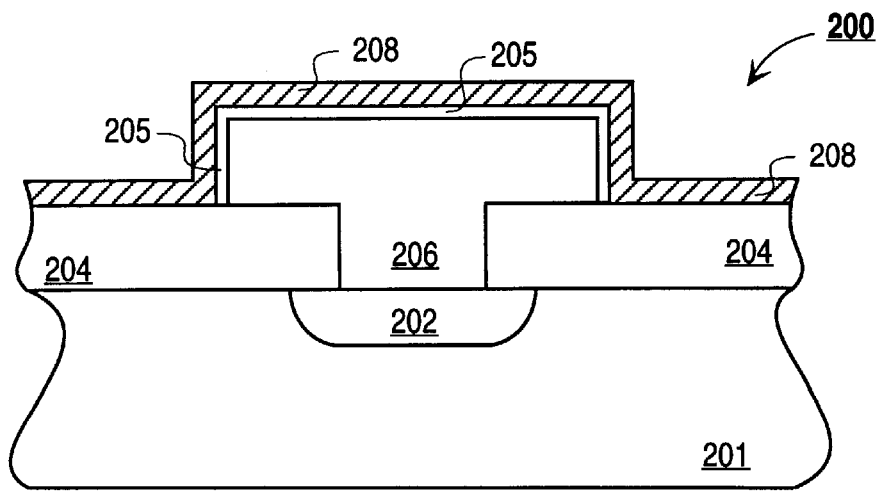

The heated substrate causes the tantalum source to decompose into tantalum (Ta) atoms and the titanium source to decompose into titanium (Ti) atoms which then react with the oxygen source gas to blanket deposit a titanium doped tantalum pentaoxide dielectric 208 over substrate 200 as shown in FIG. 2b. Deposition gas is continually fed into the deposition chamber until a titanium doped tantalum pentaoxide dielectric film 208 of a desired thickness is formed. A titanium doped tantalum pentaoxide ($Ta_2O_5$) dielectric film having a thickness between 50–200 Å provides a suitable capacitor dielectric.

Figure 2C:
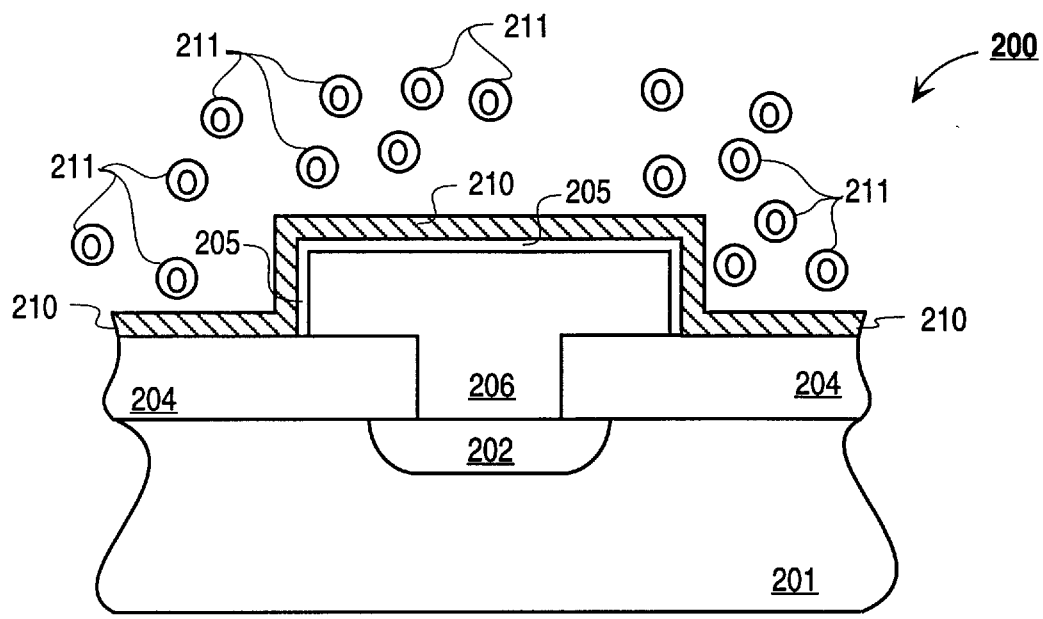
Figure 3A:
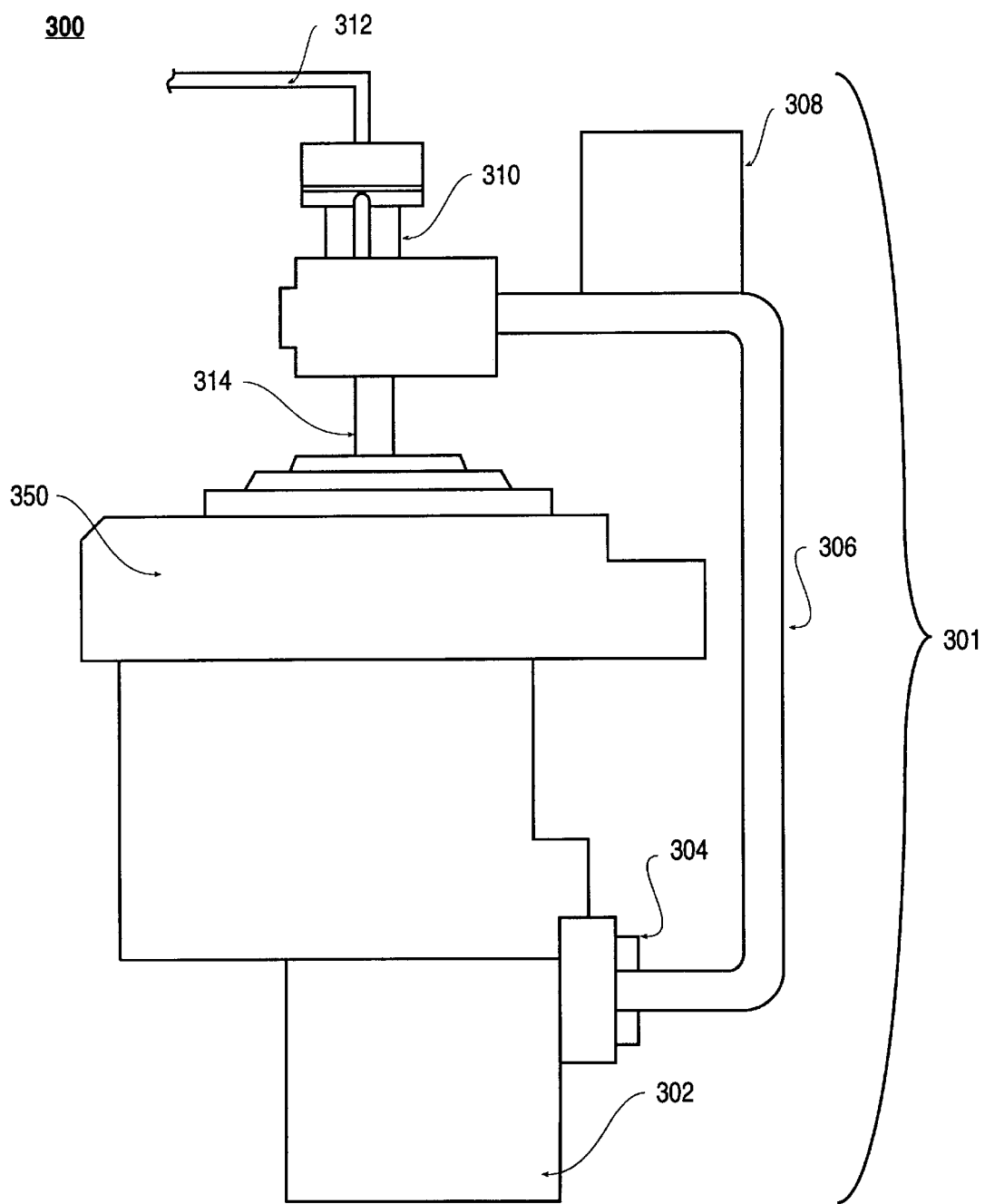
FIG. 3a is an illustration an apparatus which can be used to anneal a titanium doped tantalum pentaoxide dielectric layer.

Next, as set forth in block 108 of flow chart 100, and shown in FIG. 2c, if desired, the dielectric film 208 can be annealed, to form an annealed dielectric layer 210. If annealed, the titanium doped tantalum pentaoxide dielectric is preferably annealed with a remotely generated active atomic species as shown in FIG. 2c. An example of an apparatus 300 which can be used to provide active atomics species for annealing the titanium doped tantalum pentaoxide dielectric of present invention 13 illustrated in FIGS. 3a and 3b. An example of a commercially available apparatus which can be used to provide active atomic species is the Applied Materials Centura Advanced Strip Passivation Plus (ASP) chamber. Apparatus 300 includes a remote plasma generator 301 which generates and provides active atomic species to a process chamber 350 in which the substrate to be passivated or annealed is located. Remote plasma generator 301 includes a magnatron 302 which generates microwaves with a microwave source. Magnatron 302 can preferably generate up to 10,000 watts of 2.5 Ghz microwave energy. It is to be noted that the amount of power required is dependent (proportional) to the size of anneal chamber 350. For an anneal chamber used to process 300 mm wafers, 10,000 watts of power should be sufficient. Although a microwave source is used to generate a plasma in apparatus 300, other energy sources such as radio frequency (RF) may be used.

Magnatron 302 is coupled to an isolator and dummy load 304 which is provided for impedance matching. The dummy load absorbs the reflected power so no reflective power goes to the magnatron head. Isolator and dummy load 304 is coupled by a wave guide 306, which transmits microwave energy to an autotuner 308. Autotuner 308 consist of an impedance matching head and a separate detector module that uses three stepper motor driven impedance matching stubs to reduce the reflective power of the microwave energy directed to the power source. Autotuner 308 focuses the microwave energy into the center of a microwave applicator cavity (or chamber) 310 so that energy is absorbed by annealed gas fed into the applicator cavity 310. Although an autotuner is preferred a manual tuner may be employed.

Applicator 310 uses microwave energy received from magnatron 302 to create a plasma from the anneal gas as it flows down through a quartz plasma tube located inside applicator 310. A source 312, such as a tank, of a anneal gas such as but not limited to $O_2$, $N_2O$, and $N_2$ used for generating the active atomic species is coupled to microwave applicator 310. Additionally, a source of an inert gas such as argon (Ar), or helium (He) can also be coupled to applicator 310. A prefire mercury lamp can be used to radiate ultraviolet light into the plasma tube to partially ionize the process gases and thereby make it easier for the microwave energy to ignite the plasma.

The microwave energy from magnatron 302 converts the anneal gas into a plasma which consist of essentially three components; ionized or charged atoms (radicals), activated (reactive) atomic species, and nondissociated anneal gas. For example when $O_2$ is the anneal gas, microwave energy disassociates the $O_2$ gas into oxygen radicals, reactive oxygen atoms, and some anneal gas remains as $O_2$ molecules. When $N_2$ is the anneal gas, microwaves disassociate the $N_2$ gas into nitrogen radicals, reactive nitrogen atoms, and some anneal gas remains as $N_2$ molecules. Reactive atomic species such as reactive oxygen atoms or reactive nitrogen atoms are not charged or ionized but are highly energized atoms. Because the reactive atomic species are highly energized they are in a highly reactive state so they readily react with dielectric films to fill vacancies therein or to passivate films or substrates. Because the atomic species are highly energized when they enter anneal chamber 350, high temperatures are not necessary in chamber 350 to activate the anneal gas.

Applicator 310 is bolted to the lid of chamber 350. The concentrated plasma mixture flows downstream through conduit 314 to chamber 350. As a plasma flows through the conduit 314 the ionized atoms become electrically neutral before reaching chamber 350 and become highly reactive atomic species. Thus, only electrically neutral, highly reactive atoms flow into chamber 350. Although the process gas at this point is highly reactive, the mixture is no longer electrically damaging to the substrate or electrical devices such as transistors formed therein. Because the active atomic species are generated at location (chamber 310) which is separate or remote from the chamber 350 in which the substrate to be annealed is located, the active atomic species are said to be "remotely generated".

Figure 3B:
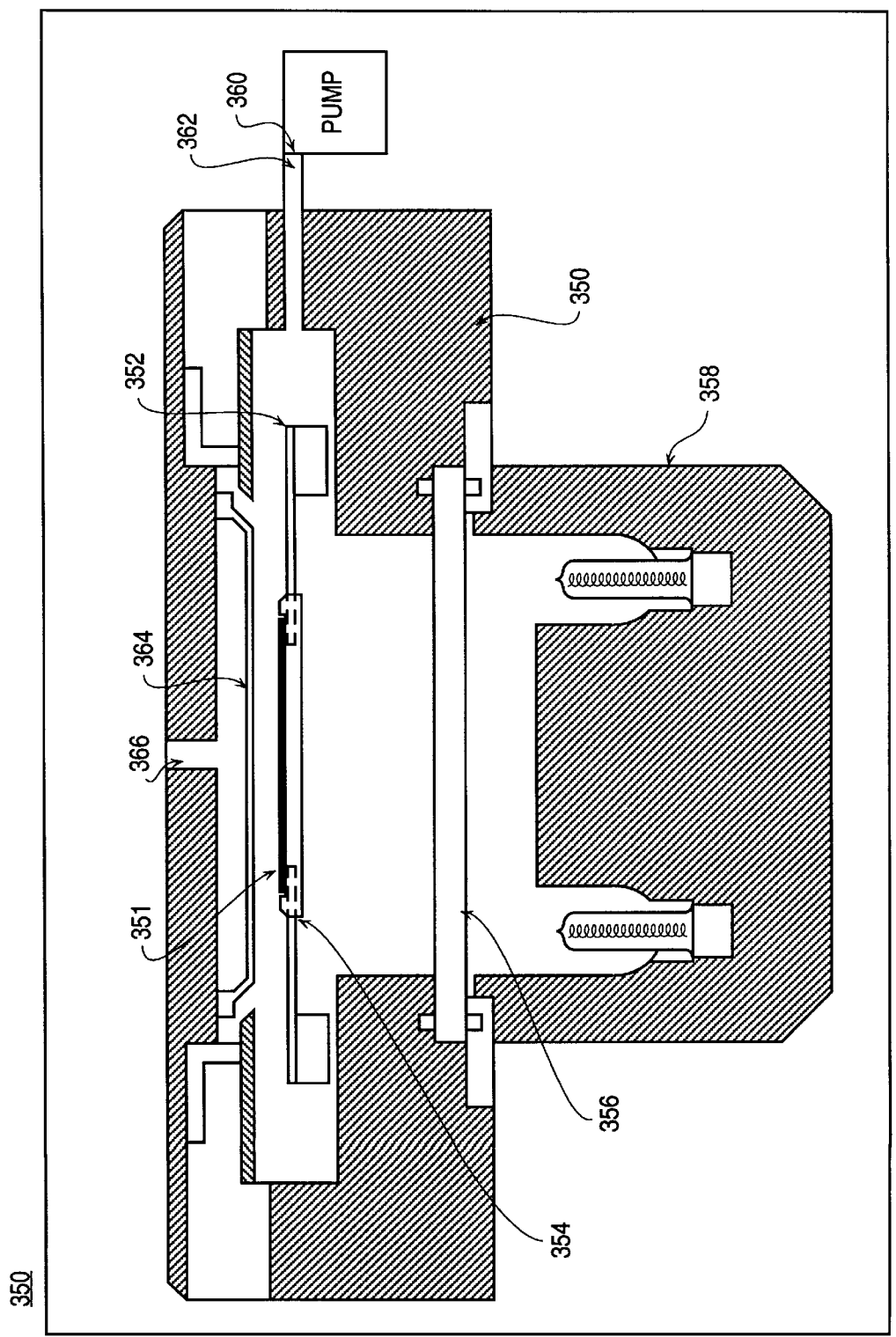
FIG. 3b is an illustration of a chamber which can be used in the apparatus of FIG. 3b.

Chamber of 350 of apparatus 300, as shown in FIG. 3b, includes a wafer support 352 for supporting a wafer or substrate 351 face up in chamber 350. Wafer support 352 can include an aluminum chuck 354. Chamber 350 includes a quartz window 356 through which infrared radiation from a plurality (14) of quartz tungsten halogen lamp 358 is transmitted. During processing, the lamps mounted directly below the process chamber radiantly heat the chuck which in turn heats the wafer by conduction. A closed loop temperature control system senses the temperature of the substrate or wafer using a thermocouple mounted in the chuck. The temperature control system regulates the temperature of the wafer by varying the intensity of lamps 358. Although lamps are preferably used as the heat source for heating the wafer, other heat sources, such as resistive heaters, can be used. A vacuum source 360, such as the pump, is coupled to an exhaust outlet 362 and controls the chamber pressure and removes gas by products. A shower head or gas distribution plate 364 is mounted directly above the wafer. Shower head 364 consist of three quartz plates having a plurality of holes formed therein to evenly distribute the active atomic species over the wafer as they flow through gas inlet 366. Dielectric film 308 can be annealed by placing substrate 200 into anneal chamber 350 coupled to remote plasma generator 300. Substrate 500 is then heated to an anneal temperature and exposed to a plasma generated by disassociating an anneal gas into radicals in chamber 310. By generating the plasma in the chamber remote from the anneal chamber (the chamber in which the substrate is situated) a low temperature anneal can be accomplished without exposing the substrate and the delicate devices formed therein to harmful microwave generation source. With the process and apparatus of the present invention anneal temperatures of less than 400° C. can be used. The remote plasma anneal step of the present invention enables anneal temperatures to be less than or equal to the deposition temperature of the dielectric film.

In one embodiment of the present invention as shown in FIG. 2c titanium doped tantalum pentaoxide dielectric film 208 is annealed with reactive oxygen atoms 211 formed by remotely disassociating $O_2$ gas. Dielectric layer 208 can be annealed in chamber 350 with a reactive oxygen atoms created by providing an anneal gas comprising two SLM of $O_2$ and one SLM of $N_2$ into chamber 310, and applying a power between 500–1500 watts to magnatron 302 to generate microwaves which causes a plasma to ignite from the anneal gas. Alternatively, reactive oxygen atoms can be formed by flowing an anneal gas comprising two SLM of $O_2$ and three SLM of argon (Ar) into cavity 310. While reactive oxygen atoms are fed into anneal chamber 350, substrate 200 is heated to a temperature of approximately 300° C. and chamber 350 maintained at an anneal pressure of approximately 2 Torr.

An inert gas, such as $N_2$ or argon (Ar), is preferably included in the anneal gas stream in order to help prevent recombination of the active atomic species. It is to be noted that as the active atomic species (e.g. reactive oxygen atoms) travel from the applicator cavity 310 to the anneal chamber 350, they collide with one another and recombine to form $O_2$ molecules. By including an inert gas, in the anneal gas mix, the inert gas does not disassociate and so provides atoms which the active atomic species can collide into without recombining. Additionally, in order to help prevent recombination of the active atomic species, it is advisable to keep the distance between cavity 310 and anneal chamber 350 as short as possible.

Annealing titanium doped tantalum pentaoxide dielectric film 208 with oxygen radicals fills oxygen vacancies (satisfies sites) in the dielectric film 208 which greatly reduces the leakage of the film. Additionally, annealing titanium doped tantalum pentaoxide dielectric 208 helps to remove carbon (C) in the film which can contribute to leakage. Carbon can be incorporated into the dielectric 208 because the tantalum and titanium sources, TAT-DMAE, TAETO, and TIPT are carbon containing compounds. The reactive oxygen atoms remove carbon from the film by reacting with carbon and forming carbon dioxide ($CO_2$) vapor which can then be exhausted out from the chamber.

Figure 2D:
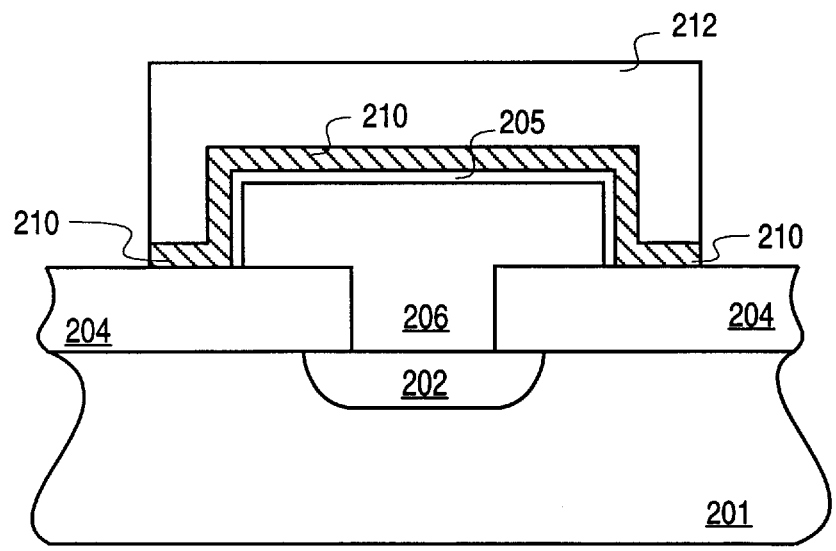
FIG. 2d is an illustration of a cross-sectional view showing the formation of a top electrode on the substrate of FIG. 2c.

The next step of the present invention, as set forth in block 110 of flow chart 100 is to complete the processing of the device. For example, as shown in FIG. 2d, a top capacitor electrode can be formed over dielectric layer 208 (or annealed dielectric layer 210). Any well known technology can be used to form top electrode 212 including blanket depositing a polysilicon film or metal film such as tungsten a TiN over dielectric film 208 and then using well known photolithography and etching techniques to pattern the electrode film and dielectric layer.

Although the present invention has been described with respect to forming a stacked capacitor, the dielectric of the present invention can be used to form other types of capacitors such as trench capacitors. Additionally, the titanium doped tantalum pentaoxide dielectric film of the present invention can be used in applications other than capacitor dielectrics. For example, it can be used as a gate dielectric layer in the fabrication of a metal-oxide semiconductor (MOS) transistor In such an application a titanium doped tantalum pentaoxide dielectric would be deposited onto a doped silicon substrate, and then a gate electrode material, such as polysilicon, would be blanket deposited over the dielectric film and then be patterned into a gate electrode. Well known doping techniques, such ion implantation or diffusion, would then be used to form source/drain regions.

A novel method and apparatus for forming a titanium doped tantalum pentaoxide dielectric film has been described. The process and equipment of the present invention enables a uniformly consistent, high quality, high dielectric constant titanium doped tantalum pentaoxide film to be formed at low temperatures, less than 500° C., and into high aspect ratio openings. Although the present invention has been described with respect to specific equipment, and with respect to a specific process it is to be appreciated that the described details are not to be taken as limiting, but rather as illustrative wherein the scope of the present invention is to be measured by the appended claims which follow.

Thus, a method and apparatus for forming a titanium doped tantalum pentaoxide dielectric film at low temperatures has been described.

We claim:

1. A method of forming a dielectric layer on a substrate, said method comprising the steps of:
   placing a substrate in a deposition chamber;
   providing a deposition gas mix comprising a source of tantalum a source of titanium, and an oxygen containing gas into said chamber; and
   decomposing said source of tantalum to form tantalum atoms, and decomposing said source of titanium to form titanium atoms in said deposition chamber; and
   reacting said titanium atoms, said tantalum atoms and said oxygen containing gas to form a tantalum pentaoxide dielectric film doped with between 5–20 atomic percent titanium.

2. The method of claim 1 wherein said source of tantalum, said oxygen containing gas and said source of titanium are thermally decomposed.

3. The method of claim 1 wherein said source of titanium, and said source of tantalum, are decomposed without utilizing microwave energy in said deposition chamber.

4. The method of claim 1 wherein said source of titanium is TIPT ($C_{12}H_{26}O_4Ti$).

5. The method of claim 4 wherein said source of titanium is liquid injected into said deposition chamber.

6. The method of claim 1 wherein said source of titanium flows through a bubbler prior to entering said reaction chamber.

7. The method of claim 1 wherein said source of tantalum is TAETO [Ta $(OC_2H_5)_5$].

8. The method of claim 1 wherein said source of tantalum is TATDME [Ta $(OC_2H_5)_4(OCHCH_2N(CH_3)_2$].

9. The method of claim 1 wherein said source of tantalum is fed into said deposition chamber at a rate of between 10–50 milligrams per minute.

10. The method of claim 1 wherein said substrate is heated to a temperature of between 300–500° C. during deposition of said tantalum pentaoxide dielectric layer doped with titanium.

11. The method of claim 1 wherein said deposition chamber has a pressure of between 0.5–10 Torr during the deposition of said tantalum pentaoxide dielectric layer doped with titanium.

12. The method of claim 1 further comprising the step of annealing said tantalum pentaoxide dielectric layer doped with titanium.

13. The method of claim 12 wherein said anneal utilizes a reactive oxygen atoms.

14. The method of claim 13 wherein said reactive oxygen atoms are generated in a chamber remote from said chamber utilized to anneal said film.

15. The method of claim 14 wherein said reactive oxygen atoms are formed from $O_2$ gas.

16. A method of forming a dielectric layer on a substrate, said method comprising the steps of:
   placing a substrate in a deposition chamber;
   heating said substrate to a temperature of between 300–500° C.;
   simultaneously providing a source of tantalum selected from the group consisting of TAETO [Ta $(OC_2H_5)_5$] and TAT-DMAE [Ta $(OC_2H_5)_4(OCHCH_2N(CH_3)_2$], TIPT ($C_{12}H_{26}O_4Ti$) and a oxygen containing gas into said chamber; and
   thermally decomposing said source of tantalum to form tantalum atoms, and thermally decomposing said TIPT to form titanium atoms in said deposition chamber; and
   reacting said titanium atoms, said tantalum atoms and said oxygen containing gas to form a tantalum pentaoxide dielectric film doped with between 5–20 atomic percent titanium.

17. The method of claim 16 wherein said source of tantalum is fed into said deposition chamber at a rate of between 10–50 milligrams per minute.

18. The method of claim 16 wherein said TIPT is diluted with IPA and said diluted TIPT fed into said deposition chamber at a rate of 5–20 mg/min.

19. The method of claim 16 wherein said oxygen containing gas is fed into said chamber at a rate of between 0.3–1.0 SLM.

20. A method of forming a dielectric layer on a substrate, said method comprising the steps of:
   placing a substrate in a deposition chamber;
   heating said substrate to a temperature of between 300–500° C.;
   generating a pressure between 0.5–10 torr in said chamber;
   simultaneously providing at a rate of between 10–50 milligrams per minute a source of tantalum, selected from the group consisting of TAETO [Ta$(OC_2H_5)_5$] and TAT-DMAE [Ta $(OC_2H_5)_4(OCHCH_2N(CH_3)_2$] into said chamber, $O_2$ gas at a rate between 0.3–1.0 SLM into said chamber, and diluted TIPT ($C_{12}H_{26}O_4Ti$) at a diluted flow rate of 5–20 mg/min into said chamber; and
   thermally decomposing said source of tantalum to form tantalum atoms, and thermally decomposing said TIPT to form titanium atoms in said deposition chamber; and
   reacting said titanium atoms, said tantalum atoms and said oxygen containing gas to form a tantalum pentaoxide dielectric film doped with between 5–20 atomic percent titanium.

21. A method of forming a dielectric film on a substrate, said method comprising steps of:
   placing the substrate in deposition chamber;

providing a deposition gas mix comprising a source of a first transition metal, a source of a second transition metal and an oxygen containing gas into said chamber;

decomposing said source of said first transition metal to form first transition metal atoms, and decomposing said source of said second transition metal to form second transition metal atoms in said deposition chamber; and reacting said first transition metal atoms, said second transition metal atoms, and said oxygen containing gas to form a first transition metal dielectric film doped with said second transition metal; and annealing said first transition metal dielectric film doped with said second transition metal at a temperature less than 400° C.

22. The method of claim 21 wherein said first transition metal is tantalum.

23. The method of claim 21 wherein said second transition metal is titanium.

24. The method of claim 21 wherein said substrate is heated to a temperature between 300–500° C.

25. The method of claim 21 wherein said deposition chamber is maintained at a pressure between 0.5–10 torr.

26. A method of forming a dielectric layer on a substrate, said method comprising the steps of:

placing a substrate in a deposition chamber;

providing a deposition gas mix comprising a source of tantalum a source of titanium, and an oxygen containing gas into said chamber;

decomposing said source of tantalum to form tantalum atoms, and decomposing said source of titanium to form titanium atoms in said deposition chamber at a first temperature;

reacting said titanium atoms, said tantalum atoms and said oxygen containing gas to form a titanium doped tantalum oxide dielectric film; and annealing said titanium doped tantalum oxide dielectric film at a temperature less than 400° C.

27. A method of forming a dielectric layer on a substrate, said method comprising the steps of:

placing a substrate in a deposition chamber;

providing a deposition gas mix comprising a source of tantalum a source of titanium, and an oxygen containing gas into said chamber;

decomposing said source of tantalum to form tantalum atoms, and decomposing said source of titanium to form titanium atoms in said deposition chamber at a first temperature;

reacting said titanium atoms, said tantalum atoms and said oxygen containing gas to form a titanium doped tantalum oxide dielectric film; and annealing said titanium doped tantalum oxide dielectric film with an activated atomic species.

28. The method of claim 27 wherein said activated atomic species comprise activated oxygen atoms.

29. A method of forming a dielectric layer on a substrate, said method comprising the steps of:

placing a substrate in a deposition chamber;

providing a deposition gas mix comprising a source of tantalum a source of titanium, and an oxygen containing gas into said chamber;

decomposing said source of tantalum to form tantalum atoms, and decomposing said source of titanium to form titanium atoms in said deposition chamber at a first temperature;

reacting said titanium atoms, said tantalum atoms and said oxygen containing gas to form a titanium doped tantalum oxide dielectric film; and annealing said titanium doped tantalum oxide dielectric film at a second temperature wherein said second temperature is less than or equal to said first temperature.

30. The method of claim 29 wherein said first temperature is less than or equal 500° C.

* * * * *